United States Patent [19]
Hirase

[11] Patent Number: 6,066,522
[45] Date of Patent: May 23, 2000

[54] SEMICONDUCTOR DEVICE AND METHOD FOR PRODUCING THE SAME

[75] Inventor: Junji Hirase, Takatsuki, Japan

[73] Assignee: Matsushita Electronics Corporation, Osaka, Japan

[21] Appl. No.: 08/923,134

[22] Filed: Sep. 4, 1997

[30] Foreign Application Priority Data

Sep. 5, 1996 [JP] Japan ..................... 8-234859

[51] Int. Cl.$^7$ ............................ H01L 21/8238
[52] U.S. Cl. .................. 438/228; 438/227; 438/232; 438/527; 438/529
[58] Field of Search .................. 438/227, 228, 438/232, 526, 527, 529, 919

[56] References Cited

U.S. PATENT DOCUMENTS

| | | | |
|---|---|---|---|
| 4,931,406 | 6/1990 | Tomioka | 438/526 |
| 5,116,777 | 5/1992 | Chan et al. . | |
| 5,401,671 | 3/1995 | Komori et al. | 438/228 |
| 5,455,437 | 10/1995 | Komori et al. . | |
| 5,501,993 | 3/1996 | Borland . | |
| 5,512,497 | 4/1996 | Ikeda et al. | 438/232 |
| 5,622,885 | 4/1997 | Merrill et al. | 438/226 |
| 5,759,883 | 6/1998 | Kinoshita | 438/232 |

FOREIGN PATENT DOCUMENTS 0 245 515   11/1987   European Pat. Off. .
42 30 687    5/1993   Germany .

OTHER PUBLICATIONS

International Search Report dated Jan. 21, 1998.
T. Morooka et al., "64MBIT DRAM", Mitsubishi Denki Giho, vol. 68, No. 3, pp. 209–212 (1994) with Partial English translation.

*Primary Examiner*—Trung Dang
*Attorney, Agent, or Firm*—Ratner & Prestia

[57] ABSTRACT

A semiconductor device include: a substrate of a conductivity type; a first well provided in the substrate and of the same conductivity type as the conductivity type of the substrate; a second well provided in the substrate and of an opposite conductivity type to the conductivity type of the substrate; and a buried well provided at a deep position in the substrate and of the opposite conductivity type to the conductivity type of the substrate. A buried well of the same conductivity type as the conductivity type of the substrate is further provided so as to be in contact with at least a part of a bottom portion of the first well so that the first well is at least partially electrically connected to the substrate.

6 Claims, 6 Drawing Sheets

SEMICONDUCTOR DEVICE AND METHOD FOR PRODUCING THE SAME

BACKGROUND OF THE INVENTION

1. Field of the Invention

The present invention relates to a high-performance semiconductor device and a method for producing the same.

2. Description of the Related Art

Recently in the field of CMOS semiconductor devices, more and more devices have adopted a triple-well structure, in which a deep well is added to the conventional twin-well structure (see, for example, technical Report of Mitsubishi Electric Corporation, Vol. 68, No. 3, pp. 7–10, 1994). The triple-well structure has been adopted in order to include two or more types of substrate potentials together in an n-well and a p-well, respectively, in one chip. An exemplary known method for producing the triple-well structure is shown in FIGS. 6A through 6E.

Specifically, as shown in FIG. 6A, first a LOCOS isolation layer 42 is formed on one of two main surfaces of a p-type semiconductor substrate 41 (also referred to simply as the "substrate 41"). Next, as shown in FIG. 6B, a resist mask 43 is formed on a prescribed area of the one main surface of the p-type semiconductor substrate 41 including the LOCOS isolation layer 42 at the corresponding positions. Then, $P^+$ (phosphorus ions) is implanted into the substrate 41 at a high acceleration energy using the mask 43, thereby forming an n-well 44 at a deep position in the substrate 41.

Then, the resist mask 43 is removed, and a different resist mask 45 is formed to cover a prescribed area of the one main surface of the substrate 41. Using the mask 45, $B^+$ (boron ions) is implanted into the substrate 41, thereby forming a first p-well 46 in the substrate 41 so as to be in contact with the deep n-well 44. By the same implantation of $B^+$, a second p-well 47 is formed in an area where the first p-well 46 is not formed, as shown in FIG. 6C. By further performing ion implantation under different conditions using the same mask 45 again, a punch-through stopper layer and a threshold voltage control layer (neither is shown in FIG. 6C) for a first n-channel MOS transistor having a deep substrate potential are formed inside the first p-well 46.

After the resist mask 45 is removed, still another resist mask 48 is formed on areas corresponding to the areas where the first p-well 46 and the second p-well 47 are formed. Using the mask 48, $P^+$ is implanted into the substrate 41, thereby forming an n-well 49 as shown in FIG. 6D. By further performing ion implantation under different conditions using the same mask 48 again, a punch-through stopper layer and a threshold voltage control layer (neither is shown in FIG. 6D) for a p-channel MOS transistor are formed inside the n-well 49.

Next, after the resist mask 48 is removed, still another resist mask 50 is formed in an area corresponding to an area excluding the area where the second p-well 47 is formed, as shown in FIG. 6E. Using the mask 50, $B^+$ is implanted into the substrate 41, whereby a punch-through stopper layer and a threshold voltage control layer (neither is shown in FIG. 6E) for a second n-channel MOS transistor having a shallow substrate potential are formed inside the second p-well 47.

The above-described conventional method for producing the triple-well structure includes additional two more mask processes, compared to the method for producing the conventional twin-well structure. Since the mask process generally involves the steps of coating, patterning and removing the masks, such additional two more mask processes tend to cause significant increase in time and cost for production.

SUMMARY OF THE INVENTION

A semiconductor device of the present invention includes: a substrate of a conductivity type; a first well provided in the substrate and of the same conductivity type as the conductivity type of the substrate; a second well provided in the substrate and of an opposite conductivity type to the conductivity type of the substrate; and a buried well provided at a deep position in the substrate and of the opposite conductivity type to the conductivity type of the substrate. A buried well of the same conductivity type as the conductivity type of the substrate is further provided so as to be in contact with at least a part of a bottom portion of the first well so that the first well is at least partially electrically connected to the substrate.

According to another aspect of the present invention, a semiconductor device includes: a substrate of a first conductivity type; a first well of a second conductivity type; a second well of the first conductivity type; a third well of the first conductivity type; a fourth well of the second conductivity type; and a fifth well of the first conductivity type. The first well is a buried well provided at a deep position in the substrate. The fourth well is in contact with a top portion of the first well. The second well is in contact with a top portion of the first well and is surrounded by the fourth well. The fifth well is a buried well provided so as to be in contact with at least a part of a bottom portion of the third well. The first well and the fifth well are provided at substantially the same level in the substrate.

In one embodiment, the entirety of a bottom portion of the third well is in contact with the fifth well.

In another embodiment, a part of a bottom portion of the third well is in contact with the fifth well, and the rest of the bottom portion of the third well is in contact with the first well.

In one embodiment, a part of the second well is a memory cell region including a memory cell transistor, and the rest of the second well is a peripheral circuit region in the vicinity of the memory cell, the peripheral circuit region including a transistor of the same channel type as the channel type of the memory cell transistor. The third well is a peripheral circuit region which is remote from the memory cell and includes a transistor of the same channel type as the channel type of the memory cell transistor, and the fourth well is a peripheral circuit region including a transistor of an opposite channel type to the channel type of the memory cell transistor.

In another embodiment, a part of the third well is a memory cell region including a memory cell transistor, and the rest of the third well is a peripheral circuit region in the vicinity of the memory cell, the peripheral circuit region including a transistor of the same channel type as the channel type of the memory cell transistor. The second well is a peripheral circuit region which is remote from the memory cell and includes a transistor of the same channel type as the channel type of the memory cell transistor. The fourth well is a peripheral circuit region including a transistor of an opposite channel type to the channel type of the memory cell transistor, and the fifth well is provided only below the memory cell region of the third well.

An interface between the memory cell region and the peripheral circuit region remote from the memory cell may exist substantially in the same plane as an interface between the fifth well and the substrate.

According to still another aspect of the present invention, a method for producing a semiconductor device is provided.

The method includes the steps of: performing ion implantation into a substrate of a first conductivity type, thereby forming a first well of a second conductivity type at a deep position in the substrate; performing ion implantation into the substrate, thereby forming a second well of the first conductivity type and a third well of the first conductivity type both in contact with a top portion of the first well; forming a fourth well of the second conductivity type at a position corresponding to an area between the second and third wells, the fourth well being formed so as to be in contact with a top portion of the first well; and performing ion implantation, thereby partially counteracting a part of the first well which is just below the third well and instead forming therein a fifth well of the first conductivity type.

In one embodiment, the step of performing the ion implantation for forming the second well and the third well is the step of performing a blanket ion implantation to the substrate using no mask. A dose of the ion implantation for forming the fourth well is set so as to obtain a prescribed effective concentration of an impurity of the second conductivity type in consideration of the concentration of an impurity of the first conductivity type obtained by the blanket ion implantation.

In one embodiment, during the step of performing the ion implantation for forming the fifth well, a threshold voltage control layer of a transistor to be formed in the third well is simultaneously formed.

In one embodiment, the step of performing the ion implantation for at least partially counteracting a part of the first well includes the step of entirely counteracting the part of the first well which is just below the third well and instead forming therein the fifth well.

Alternatively, the step of performing the ion implantation for at least partially counteracting a part of the first well includes the step of only partially counteracting the part of the first well which is just below the third well and instead forming therein the fifth well.

In one embodiment, the step of performing the ion implantation for forming the fifth well includes the step of forming a resist mask to cover an area of the third well where a memory cell is to be formed and then performing ion implantation.

Thus, the invention described herein makes possible the advantages of (1) providing a high-performance semiconductor device having a triple-well structure which can be produced only with adding a minimum possible number of production steps, and (2) providing a method for producing such a semiconductor device.

These and other advantages of the present invention will become apparent to those skilled in the art upon reading and understanding the following detailed description with reference to the accompanying figures.

DESCRIPTION OF THE PREFERRED EMBODIMENTS

EXAMPLE 1

Figure 1:
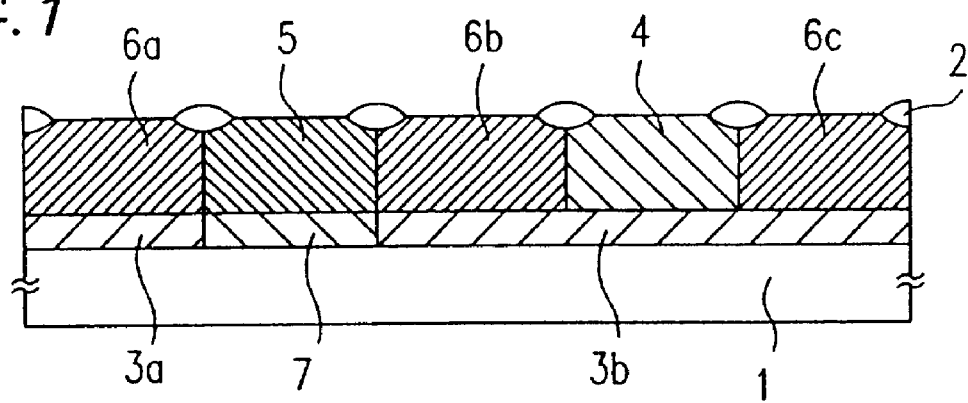
FIG. 1 is a cross-sectional view schematically illustrating a structure of a semiconductor device in a first example according to the present invention.

FIG. 1 is a cross-sectional view illustrating a structure of a semiconductor device in a first example according to the present invention.

As shown in FIG. 1, in the semiconductor device in the first example, a first p-well 4 and a second p-well 5 are selectively provided along one of two main surfaces of a p-type semiconductor substrate 1 (also referred to simply as the "substrate 1"). The first p-well 4 is surrounded by n-wells 6b and 6c, provided adjacent to the first p-well 4, and a deep n-well (also referred to as the "buried n-well") 3b which is provided at a deep position so as to be in contact with the bottom portions of the first p-well 4 and the n-wells 6b and 6c. The second p-well 5, on the other hand, is electrically connected to the semiconductor substrate 1 via a deep p-well (also referred to as the "buried p-well") 7 which is provided just below the second p-well 5 so as to be in contact with the second p-well 5.

As a result, the first p-well 4 and the second p-well 5 are electrically isolated from each other, and therefore the first p-well 4 and the second p-well 5 can be set to different potentials from each other.

In the following description, for the purpose of simplification, the n-wells 6a, 6b and 6c are collectively referred to as the "n-well(s) 6", and the buried n-wells 3a and 3b are collectively referred to as the "buried n-well(s) 3".

A LOCOS oxide layer (isolation region) 2 is provided at respective borders between the wells 4 and 6 and between the wells 5 and 6 on the one main surface of the semiconductor substrate 1.

The buried n-well 3 and the buried p-well 7 are provided at substantially the same level in the semiconductor substrate 1. Accordingly, the bottom portions of the first and second p-wells 4 and 5 are at substantially the same level as the bottom portion of the n-wells 6.

In this example, the second p-well 5 is provided adjacent to the n-wells 6. Alternatively, the n-well 6 can be surrounded by the second p-wells 5, in which case the potential of the n-well 6 can be independently varied as in the conventional device.

With reference to FIGS. 2A through 2E, a method for producing the semiconductor device in the first example will be described.

Figure 2A:
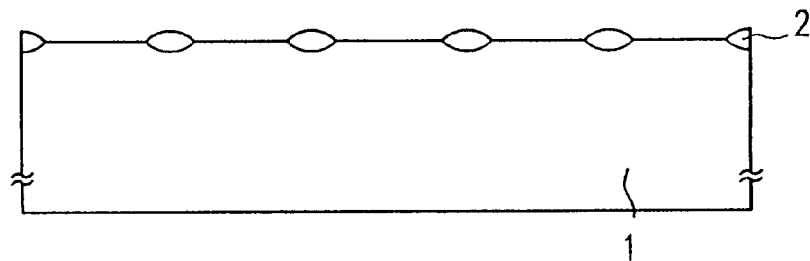
FIGS. 2A through 2E are cross-sectional views schematically illustrating a method for producing the semiconductor device shown in FIG. 1.

First, as shown in FIG. 2A, in a prescribed area of one of two main surfaces of the p-type semiconductor substrate 1 having a resistivity of, for example, about $1 \times 10^{15}$ cm$^{-3}$, a LOCOS oxide layer 2 having a thickness of, for example, about 300 nm is selectively formed. As the semiconductor substrate 1, a silicon substrate is used, for example.

Figure 2B:
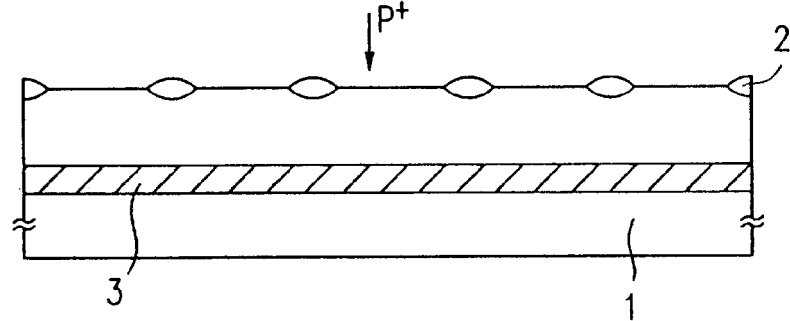

Next, as shown in FIG. 2B, P$^+$ (phosphorus ions) is implanted through the entirety of the one main surface of the semiconductor substrate 1, thereby forming a buried n-well 3 at a deep position in the substrate 1. The implantation is performed under the condition of, for example, at an acceleration energy of about 1200 keV and a dose of about $3 \times 10^{12}$ cm$^{-2}$.

Figure 2C:
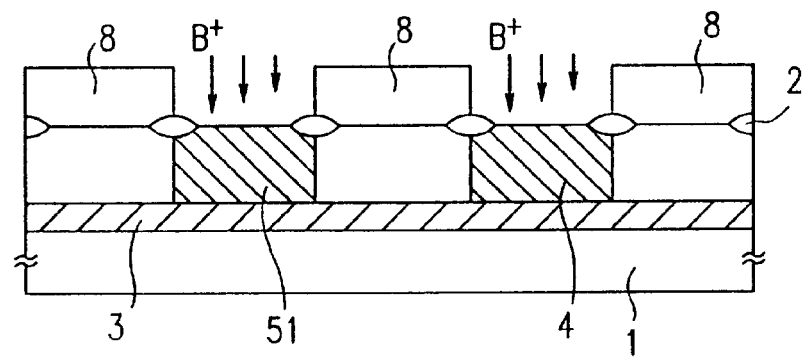

Then, as shown in FIG. 2C, a resist layer 8 is selectively formed on a prescribed area of the one main surface of the substrate 1 by a known method. Using the resist layer 8 as a mask, B$^+$ is implanted through the one main surface of the substrate 1 under three different conditions: (1) an acceleration energy of about 400 keV and a dose of about $1\times10^{13}$ cm$^{-2}$; (2) an acceleration energy of about 100 keV and a dose of about $3\times10^{12}$ cm$^{-2}$; and (3) an acceleration energy of about 20 keV and a dose of about $2\times10^{12}$ cm$^{-2}$. As a result, the first p-well 4 is formed so as to be in contact with a top portion of the buried n-well 3, and also a punch-through stopper layer and a threshold voltage control layer (neither is shown in the figures) for a first n-channel MOS transistor to be formed in the first p-well 4 are formed in the p-well 4.

By the above-described ion implantation, B$^+$ is also implanted into an area 51 in which the second p-well 5 (see FIG. 2E) is to be formed. As a result, the formation of the second p-well 5 in the area 51 is almost completed, and a similar layer structure is formed including a punch-through stopper layer and a threshold voltage control layer (neither is shown in the figures) inside the area 51.

Figure 2D:
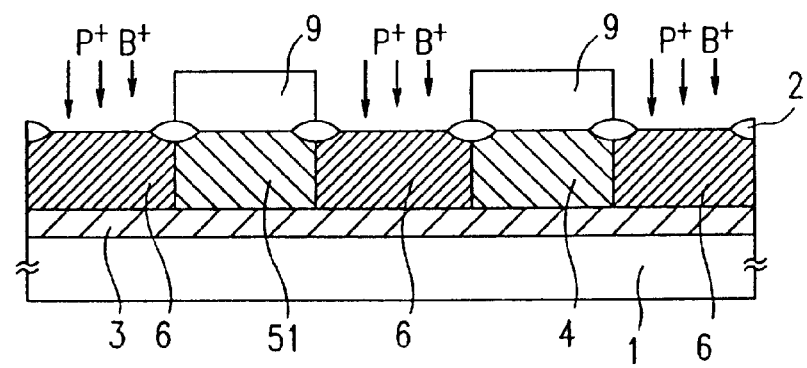

After the resist layer 8 is removed, as shown in FIG. 2D, a resist layer 9 is formed so as to selectively cover an area which was not covered by the resist layer 8. Using the resist layer 9 as a mask, P$^+$ is implanted through the one main surface of the semiconductor substrate 1 under two different conditions: (1) an acceleration energy of about 700 keV and a dose of about $1\times10^{13}$ cm$^{-2}$; and (2) an acceleration energy of about 200 keV and a dose of about $3\times10^{12}$ cm$^{-2}$. Furthermore, using the same resist layer 9 as a mask again, B$^+$ is implanted through the one main surface of the semiconductor substrate 1 at an acceleration energy of about 20 keV and a dose of about $3\times10^{12}$ cm$^{-2}$. As a result, the n-well 6 is formed so as to be in contact with a top portion of the buried n-well 3, and also a punch-through stopper layer and a threshold voltage control layer (neither is shown in the figures) for a p-channel MOS transistor to be formed in the n-well 6 are formed inside the n-well 6.

Figure 2E:
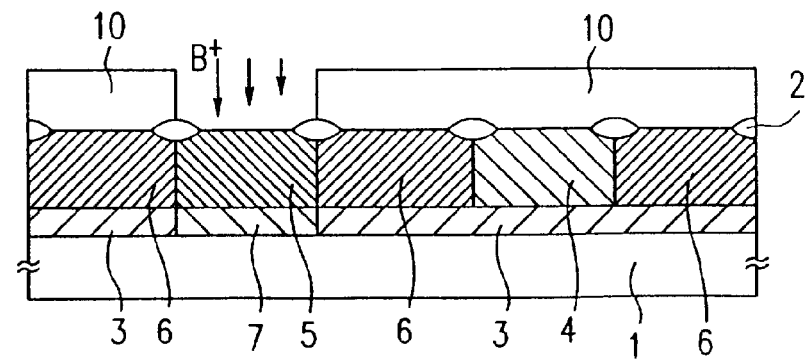

After the resist layer 9 is removed, as shown in FIG. 2E, a resist layer 10 is formed so as to cover a part of the surface of the semiconductor substrate 1 excluding an area corresponding to the area 51 (where a second p-well 5 is to be formed) shown in FIG. 2D. Using the resist layer 10 as a mask, B$^+$ is implanted through the one main surface of the semiconductor substrate 1 in three different conditions: (1) an acceleration energy of about 700 keV and a dose of about $1\times10^{13}$ cm$^{-2}$; (2) an acceleration energy of about 130 keV and a dose of about $2\times10^{12}$ cm$^{-2}$; and (3) an acceleration energy of about 20 keV and a dose of about $2\times10^{12}$ cm$^{-2}$. As a result, the second p-well 5 is formed in the area 51. Moreover, a part of the buried n-well 3 which is positioned just below the second p-well 5 is counteracted by this counter implantation process, and instead a deep p-well (buried p-well) 7 is formed therein so as to be in contact with the second p-well 5. Furthermore, by this B$^+$ implantation step described with reference to FIG. 2E and the previous B$^+$ implantation step described with reference to FIG. 2C, a punch-through stopper layer and a threshold voltage control layer (neither is shown in the figures) for a second n-channel MOS transistor which is to be formed inside the buried p-well 7 are formed.

When applying the semiconductor device in this example to a DRAM, it is effective to use the first p-well 4 which is not electrically connected to the substrate 1 as an NMOS region with a memory cell as well as a peripheral circuit in the vicinity of the memory cell such as a sensing amplifier (in other words, a region having a back bias), and to use the second p-well 5 which is electrically connected to the substrate 1 as an NMOS region with the other peripheral circuits (in other words, a region not having a back bias). This is because, for example, no counter implantation process is necessary for the purpose of the threshold voltage control, resulting in suppressed reduction of mobility which otherwise is brought by the impurities.

The above-described structure will be described more specifically. A part of the first p-well 4 is a memory cell region including a memory cell transistor, and the rest of the first p-well 4 is a peripheral circuit region in the vicinity of the memory cell which includes a transistor of the same channel type with that of the memory cell transistor. The second p-well 5 is a peripheral circuit region which is remote from the memory cell and includes a transistor of the same channel type as that of the memory cell transistor. The n-well 6 is a peripheral transistor region including a transistor of an opposite channel type to that of the memory cell transistor.

In the above-described arrangement, a circuit portion such as a power supply circuit or the like, where latch-up occurs relatively easily, is positioned in regions having an improved resistance against latch-up because of the presence of the deep n-well (the buried n-well) 3 and the deep p-well (the buried p-well) 7. Accordingly, such an arrangement is advantageous in improving the resistance against the latch-up of the entire semiconductor chip to be formed.

EXAMPLE 2

With reference to FIGS. 3A through 3D, a method for producing a semiconductor device in a second example according to the present invention will be described.

In the first example, the first p-well 4, the second p-well 5, and the n-wells 6 are formed by use of the resist layers (acting as masks) 8, 9 and 10 having different patterns from one anther. In the second example, a p-well is formed without using a mask, i.e., through a blanket ion implantation performed to the entire surface of the substrate 1. In the subsequent formation of the n-well, part of impurities to be implanted for forming the n-well is canceled by the impurities of the opposite conductivity which have been previously implanted in the blanket implantation. In consideration of such counteraction, a dose for the subsequent n-well formation is set to be slightly greater than necessary, whereby a prescribed effective impurity concentration is obtained.

Figure 3A:
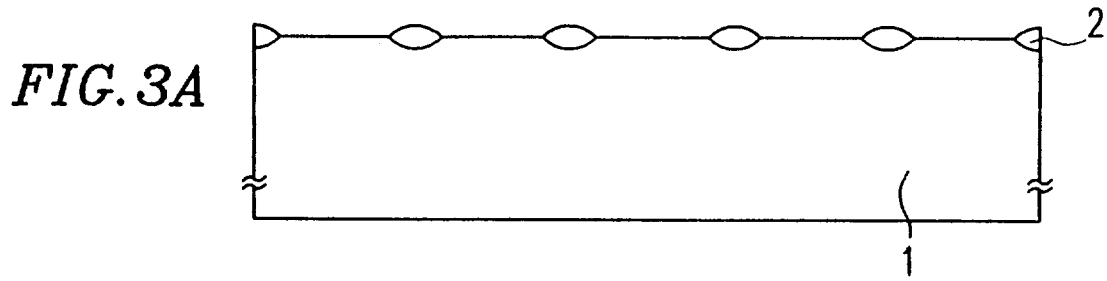
FIGS. 3A through 3D are cross-sectional views schematically illustrating a method for producing a semiconductor device in a second example according to the present invention.
Figure 3B:
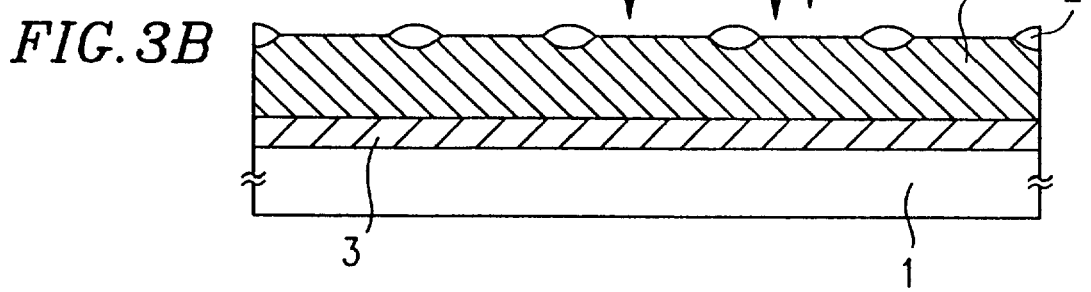

Specifically, first as shown in FIG. 3A, in a prescribed area of one of two main surfaces of a p-type semiconductor substrate 1 having a resistivity, for example, of about $1\times10^{15}$ cm$^{-3}$, a LOCOS oxide layer 2 having a thickness of, for example, about 300 nm is selectively formed. As the semiconductor substrate 1, a silicon substrate is used, for example. Next, as shown in FIG. 3B, P$^+$ (phosphorus ions) is implanted through the entirety of the one main surface of the semiconductor substrate 1, thereby forming a buried n-well 3 at a deep position in the substrate 1. The implantation is formed under the condition of, for example, at an acceleration energy of about 1200 keV and a dose of about $3\times10^{12}$ cm$^{-2}$.

Then, B$^+$ is implanted through the one main surface of the substrate 1 under three different conditions: (1) an acceleration energy of about 400 keV and a dose of about $1\times10^{13}$ cm$^{-2}$; (2) an acceleration energy of about 100 keV and a dose of about $3\times10^{12}$ cm$^{-2}$; and (3) an acceleration energy of about 20 keV and a dose of about $2\times10^{12}$ cm$^{-2}$. As a result, a p-type area 30 is formed so as to be in contact with a top portion of the buried n-well 3, and also a punch-through stopper layer and a threshold voltage control layer (neither is shown in the figures) for a MOS transistor to be formed in the p-type area 30 are formed inside the area 30.

Figure 3C:
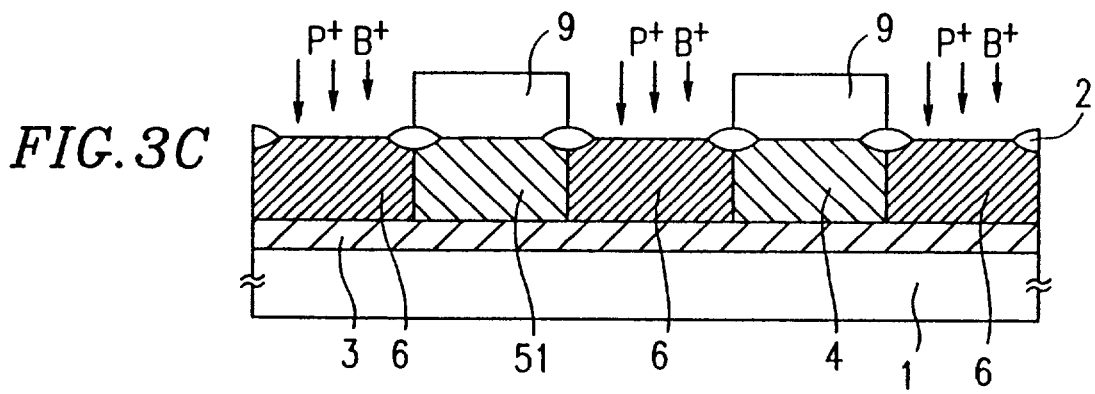

Next, as shown in FIG. 3C, a resist layer 9 is formed so as to selectively cover part of the one main surface of the substrate 1 excluding areas corresponding to the areas where n-wells 6 are respectively to be formed. Using the resist layer 9, P$^+$ is implanted through the one main surface of the semiconductor substrate 1 under two different conditions: (1) an acceleration energy of about 700 keV and a dose of about $2\times10^{13}$ cm$^{-2}$; and (2) an acceleration energy of about 200 keV and a dose of about $6\times10^{12}$ cm$^{-2}$. Furthermore, using the same resist layer 9 as a mask again, B$^+$ is implanted through the one main surface of the semiconductor substrate 1 at an acceleration energy of about 20 keV and a dose of about $1\times10^{12}$ cm$^{-2}$. As a result, a conductivity type of a predetermined portion of the p-type area 30 is effectively changed into n-type by this counter implantation, whereby the n-wells 6 are formed so as to be in contact with a top portion of the buried n-well 3. In addition, a punch-through stopper layer and a threshold voltage control layer (neither is shown in the figures) for a p-channel MOS transistor to be formed in the n-wells 6 are formed in the n-wells 6.

Figure 3D:
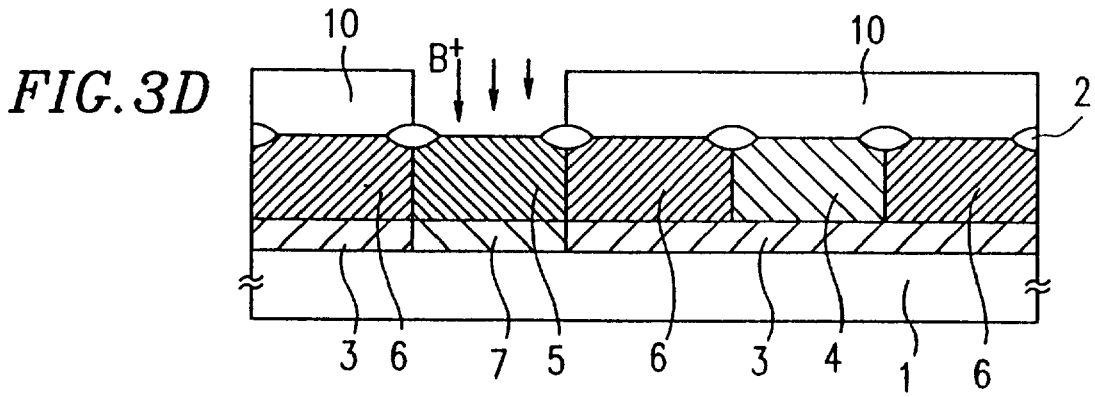

After the resist layer 9 is removed, as shown in FIG. 3D, a resist layer 10 is formed so as to cover a part of the one main surface of the semiconductor substrate 1 excluding an area corresponding to an area 51 (where a second p-well 5 is to be formed) shown in FIG. 3C. Using the resist layer 10 as a mask, B$^+$ is implanted through the one main surface of the semiconductor substrate 1 under three different conditions: (1) an acceleration energy of about 700 keV and a dose of about $1\times10^{13}$ cm$^{-2}$; (2) an acceleration energy of about 130 keV and a dose of about $2\times10^{12}$ cm$^2$; and (3) an acceleration energy of about 20 keV and a dose of about $2\times10^{12}$ cm$^{-2}$. As a result, the second p-well 5 is formed in the area 51. In addition, a portion of the p-type area 30 excluding the n-wells 6 and the second p-well 5 is referred to as a first p-well 4.

Moreover, a part of the buried n-well 3 which is positioned just below the second p-well 5 is counteracted by the counter implantation process, and instead a deep p-well (buried p-well) 7 is formed therein so as to be in contact with the second p-well 5. By this B$^+$ implantation step described with reference to FIG. 3D and the previous B$^+$ implantation step described with reference to FIG. 2C, a punch-through stopper layer and a threshold voltage control layer (neither is shown in the figures) for a second n-channel MOS transistor which is to be formed inside the buried p-well 7 are formed.

The buried n-well 3 and the buried p-well 7 are formed at substantially the same level in the substrate 1. Thus, the bottom portions of the first and second p-wells 4 and 5 are positioned at substantially the same level as that of the bottom portion of the n-wells 6.

In the above-described method, the p-type area 30 to be used for forming the p-wells is formed by the blanket implantation without using a mask. Alternatively, n-wells can be formed by the blanket implantation without using any mask.

As in the first example, when the semiconductor device in this example is applied to a DRAM, it is effective to use a first p-well 4, which is not electrically connected to the substrate 1, as an NMOS region with a memory cell and a peripheral circuit in the vicinity of the memory cell such as a sensing amplifier (in other words, a region having a back bias), and to use a second p-well 5, which is electrically connected to the substrate 1, as an NMOS region with the other peripheral circuits (in other words, a region not having a back bias).

EXAMPLE 3

Figure 4:
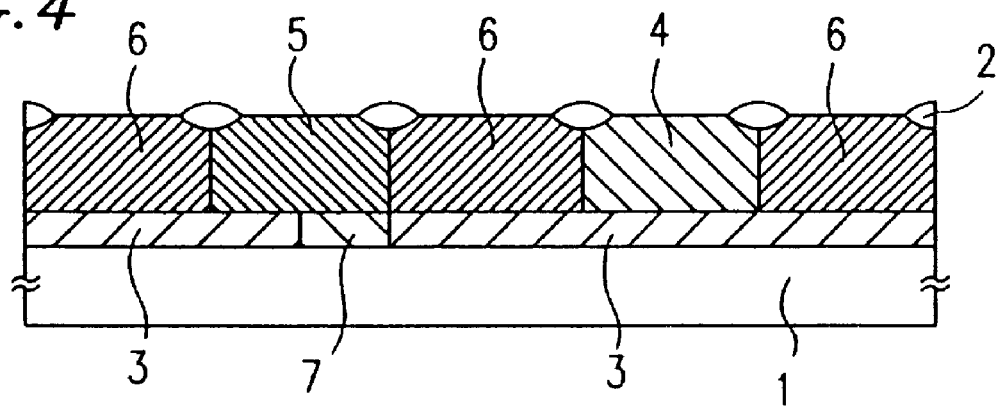
FIG. 4 is a cross-sectional view schematically illustrating a structure of a semiconductor device in a third example according to the present invention.

FIG. 4 is a cross-sectional view of a semiconductor device in a third example according to the present invention.

As shown in FIG. 4, in the semiconductor device in the third example, a first p-well 4 and a second p-well 5 are selectively formed along one of main surfaces of a p-type semiconductor substrate 1. The first p-well 4 is, as in the first example, surrounded by the n-wells 6, adjacent to the first p-well 4, and a deep n-well (buried n-well) 3 formed at a deep position in the substrate 1 so as to be in contact with a bottom portion of the first p-well 4 and a bottom portion of the n-wells 6. On the other hand, the second p-well 5 is, unlike in the first example, electrically connected with the semiconductor substrate 1 via a deep p-well (buried p-well) 7 located just below the second p-well 5 and in contact with the second p-well 5. Unlike in the first example, the buried p-well 7 is provided so as to be in contact with only a part of a bottom portion of the second p-well 5, and the rest of the bottom portion of the second p-well 5 is in contact with the buried n-well 3.

As a result, the first p-well 4 and the second p-well 5 are electrically isolated from each other, and thus the first p-well 4 and the second p-well 5 are set to different potentials from each other.

A LOCOS oxide layer 2 is provided at respective borders between the wells 4 and 6 and between the wells 5 and 6 on the one main surface of the semiconductor substrate 1.

The buried n-well 3 and the buried p-well 7 are formed at substantially the same level in the semiconductor substrate 1. Accordingly, the bottom portions of the first and second p-wells 4 and 5 are at substantially the same level as that of the bottom portion of the n-wells 6.

In this example, the second p-well 5 is provided adjacent to the n-wells 6. Alternatively, the n-well 6 can be surrounded by the second p-wells 5, in which case the potential of the n-well 6 can be independently varied as in the conventional device.

With reference to FIGS. 5A through 5F, a method for producing the semiconductor device in the third example will be described.

Figure 5A:
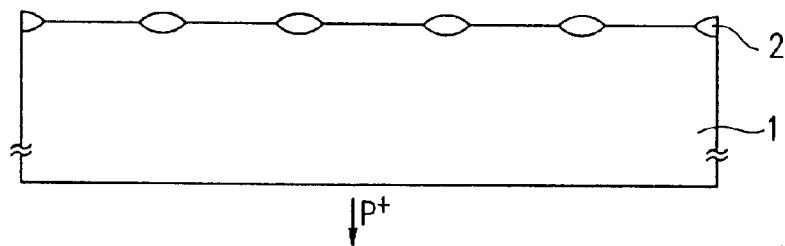
FIGS. 5A through 5F are cross-sectional views schematically illustrating a method for producing the semiconductor device shown in FIG. 4.

First, as shown in FIG. 5A, in a prescribed area of one of two main surfaces of the p-type semiconductor substrate 1 having a resistivity of, for example, about $1\times10^{15}$ cm$^{-3}$, a LOCOS oxide layer 2 having a thickness of, for example, about 300 nm is selectively formed. As the semiconductor substrate 1, a silicon substrate is used, for example.

Figure 5B:
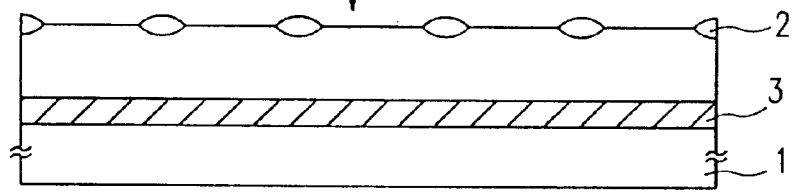

Next, as shown in FIG. 5B, P$^+$ (phosphorus ions) is implanted through the entirety of the surface of the semiconductor substrate 1, thereby forming a buried n-well 3 at a deep position in the substrate 1. The implantation is formed under the condition of, for example, at an acceleration energy of about 1200 keV and a dose of about $3\times10^{12}$ cm$^{-2}$.

Figure 5C:
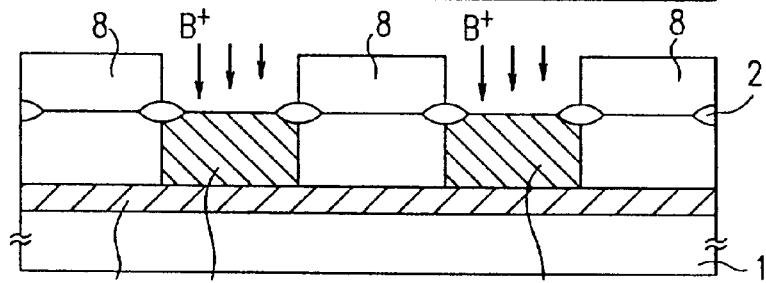

Then, as shown in FIG. 5C, a resist layer 8 is selectively formed on a prescribed area of the main surface of the substrate 1 by a known method. Using the resist layer 8 as a mask, B$^+$ is implanted through the one main surface of the substrate 1 under three different conditions: (1) an acceleration energy of about 400 keV and a dose of about $1\times10^{13}$ cm$^{-2}$; (2) an acceleration energy of about 100 keV and a dose of about $3\times10^{12}$ cm$^{-2}$; and (3) an acceleration energy of about 20 keV and a dose of about $2\times10^{12}$ cm$^{-2}$. As a result, impurities are implanted into an area 40 (where the first p-well 4 as shown in FIG. 5E is to be formed so as to be in contact with the upper portion of the buried n-well 3) at such a level that allows the area 40 to function as the first p-well 4. Furthermore, a punch-through stopper layer and a threshold voltage control layer (neither is shown in the figures) for a first n-channel MOS transistor to be formed in the area 40 are formed therein.

In addition, in the above-described ion implantation, B$^+$ is also implanted into an area 51, whereby the second p-well 5 is formed therein. Furthermore, a similar layer structure is formed including a punch-through stopper layer and a threshold voltage control layer (neither is shown in the figures) inside the second p-well 5.

Figure 5D:
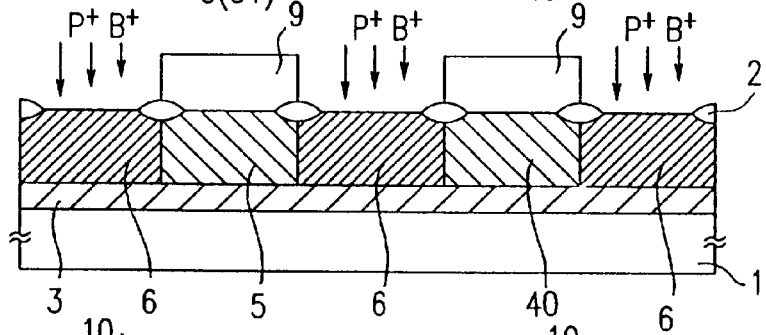
Figure 5E:
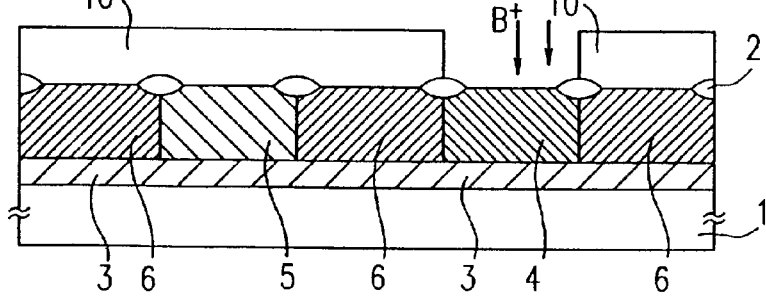

After the resist layer 8 is removed, as shown in FIG. 5D, a resist layer 9 is formed so as to selectively cover an area which was not covered by the resist layer 8. Using the resist layer 9 as a mask, P$^+$ is implanted through the one main surface of the semiconductor substrate 1 under two different conditions: (1) an acceleration energy of about 700 keV and a dose of about $1\times10^{13}$ cm$^{-2}$; and (2) an acceleration energy of about 200 keV and a dose of about $3\times10^{12}$ cm$^{-2}$. Furthermore, using the same resist layer 9 as a mask again, B$^+$ is implanted through the one main surface of the semiconductor substrate 1 at an acceleration energy of about 20 keV and a dose of about $3\times10^{12}$ cm$^{-2}$. As a result, the n-wells 6 are formed so as to be in contact with the top portion of the buried n-well 3, and also a punch-through stopper layer and a threshold voltage control layer (neither is shown in the figures) for a p-channel MOS transistor to be formed in the n-wells 6 are formed inside the n-wells 6.

After the resist layer 9 is removed, as shown in FIG. 5E, a resist layer 10 is formed so as to cover a part of the one main surface of the semiconductor substrate 1 excluding an area corresponding to the area 40. Using the resist layer 10 as a mask, B$^+$ is implanted through the one main surface of the semiconductor substrate 1 under two different conditions: (1) an acceleration energy of about 130 keV and a dose of about $2\times10^{12}$ cm$^{-2}$; and (2) an acceleration energy of about 20 keV and a dose of about $2\times10^{12}$ cm$^{-2}$. As a result, by this B$^+$ implantation step described with reference to FIG. 5E and the previous B$^+$ implantation step described with reference to FIG. 5C, the first p-well 4 is formed in the area 40, and a punch-through stopper layer and a threshold voltage control layer (neither is shown in the figures) for a first n-channel MOS transistor which is to be formed in the area 40 are formed therein.

Figure 5F:
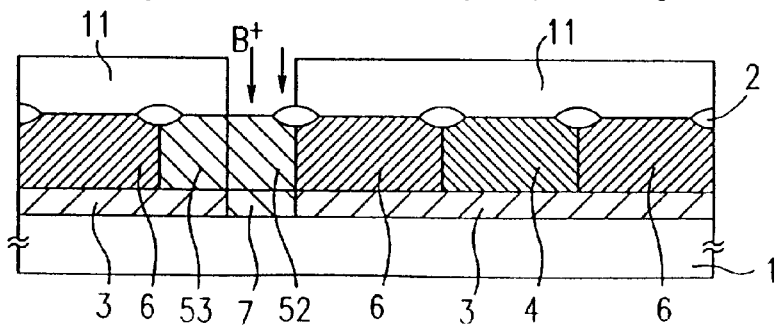
Figure 6A:
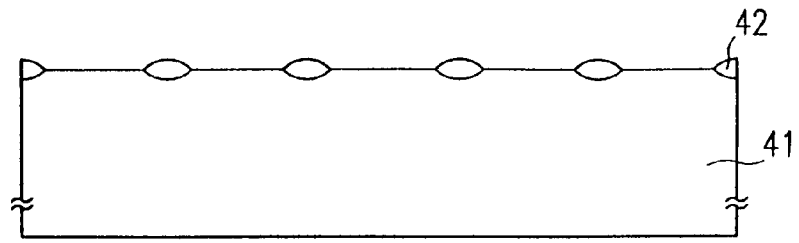
FIGS. 6A through 6E are cross-sectional views schematically illustrating a method for producing a conventional semiconductor device.
Figure 6B:
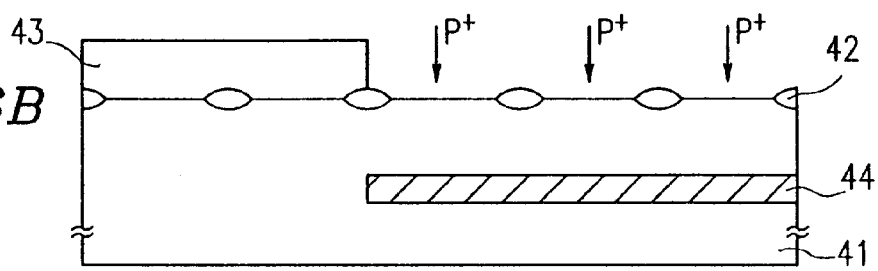
Figure 6C:
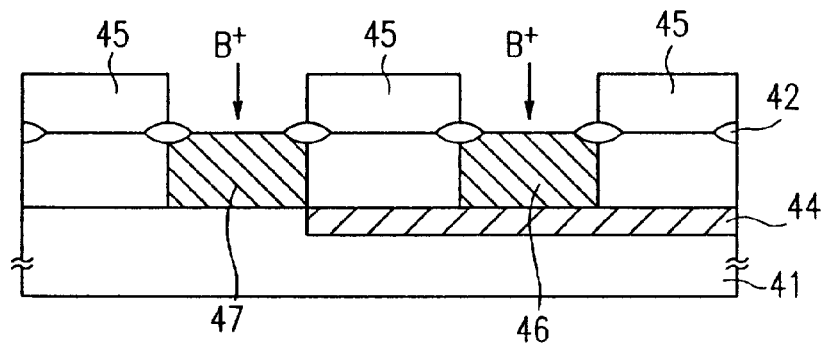
Figure 6D:
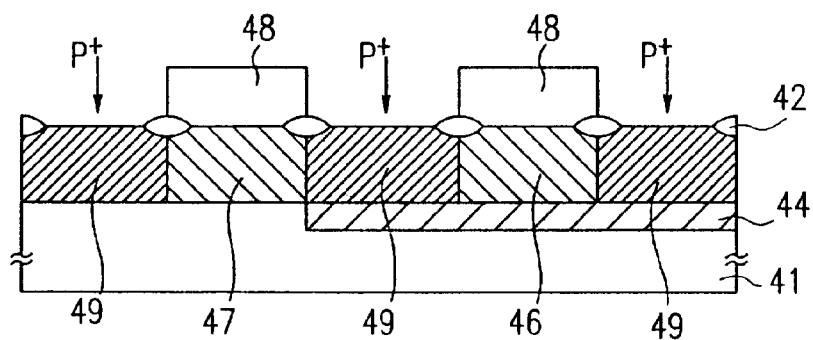
Figure 6E:
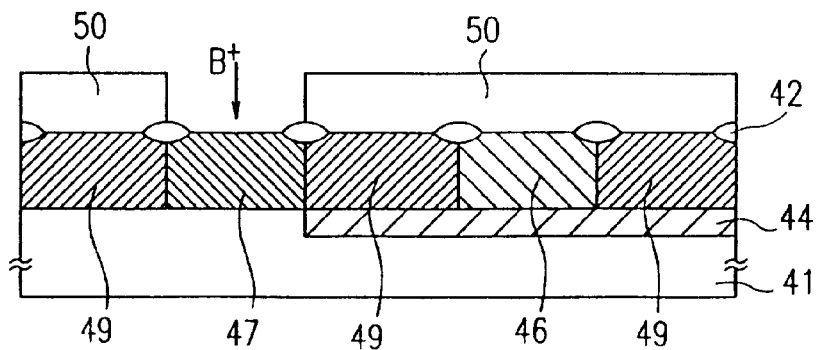

After the resist layer 10 is removed, as shown in FIG. 5F, a resist layer 11 is formed so as to cover a part of the one main surface of the semiconductor substrate 1 excluding an area corresponding to a partial area 52 of the second p-well 5 shown in FIG. 5D. Using the resist layer 11 as a mask, B$^+$ is implanted through the one main surface of the semiconductor substrate 1 under two different conditions: (1) an acceleration energy of about 700 keV and a dose of about $1\times10^{13}$ cm$^{-2}$; and (2) an acceleration energy of about 20 keV and a dose of about $3\times10^{12}$ cm$^{-2}$. As a result, a part of the buried n-well 3 which is positioned just below the partial area 52 of the second p-well 5 is counteracted by the counter implantation process, and instead a deep p-well (buried p-well) 7 is formed therein so as to be in contact with the second p-well 5. Furthermore, by this B$^+$ implantation step described with reference to FIG. 5F and the previous B$^+$ implantation step described with reference to FIG. 5C, a punch-through stopper layer and a threshold voltage control layer (neither is shown in the figures) for a third n-channel MOS transistor which is to be formed inside the buried p-well 7 are formed. It should be noted that this B$^+$ implantation described with reference to FIG. 5F, no impurity is implanted into a remaining area 53 which is a part of the p-well 5 excluded from the area 52.

As described above, in the third example, unlike in the first example, ion implantation for forming a buried p-well is performed simultaneously with the ion implantation for controlling the threshold voltage of the third n-channel MOS transistor.

In the third example as described above, the first and second p-wells 4 and 5 as well as the n-wells 6 are formed using the resist layers 8 through 11 having different patterns from one another. Alternatively, as in the second example, the p-well can be formed by the blanket implantation process without using a mask. In such a case, in the subsequent formation of the n-well, part of impurities to be implanted for forming the-n-well is canceled by the impurities of the opposite conductivity which have been previously implanted in the blanket implantation. In consideration of such counteraction, a dose for the subsequent n-well formation is set to be slightly greater than necessary, whereby a prescribed effective impurity concentration is obtained. Alternatively, in lieu of forming the p-well, the n-well can be formed by the blanket implantation without using any mask.

When the semiconductor device in this example is applied to a DRAM, a preferable function of the first p-well 4 and a preferable function of the second p-well 5 are switched with each other, as compared to those in the first and second examples. Specifically, when the semiconductor device in this example is applied to a DRAM, it is preferable to use the area 52 of the second p-well 5, which is electrically connected to the substrate 1 via the buried p-well 7, as a memory cell region 52; to use the remaining area 53 of the p-well 5, which is not directly electrically connected to the substrate 1, as an NMOS region of a peripheral circuit in the vicinity of the memory cell such as a sensing amplifier (in other words, a region having a back bias); and to use the first p-well 4 as an NMOS region of the other peripheral circuits (in other words, a region not having a back bias). This is because, for example, no counter implantation process is involved for the purpose of the threshold voltage control, resulting in suppressed reduction of mobility which otherwise is brought by the impurities. In the above-described arrangement, the second and third n-channel NMOS transistors formed in the second p-well 5 respectively act as a peripheral circuit transistor and a memory cell transistor.

The above-described structure will be described more specifically. The partial area 52 of the second p-well 5 is a memory cell region 52 including a memory cell transistor, and the remaining area 53 is a peripheral circuit region 53 in the vicinity of the memory cell which includes a transistor of the same channel type as that of the memory cell transistor. The first p-well 4 is a peripheral circuit region which is remote from the memory cell and includes a transistor of the same channel type as that of the memory cell transistor. The n-wells 6 function as a peripheral transistor region including a transistor of an opposite channel type to that of the memory cell transistor. The buried p-well 7 is formed only just below the memory cell region 52 of the second p-well 5 and is electrically connected with the substrate 1.

In the above-described structure, the first p-well 4, in which an input/output circuit or the like generating a great number of hot carriers or other carriers which can be noise by undershoot/overshoot phenomena, is surrounded by the n-wells 6 and the buried n-well 3. By such a structure, the first p-well 4 is electrically isolated, thereby preventing the carriers, generated in one p-well 4 for the above-mentioned reasons, from flowing into another first p-well 4. Thus, adverse effect such as malfunction caused by noise can be restricted. Furthermore, in the case where minority carriers are generated at a deep portion of a substrate due to some reasons such as radiation and then diffused in the substrate, those minority carriers are likely to be trapped in the buried n-well since an open area leading to a memory cell portion is narrow. As a result, any adverse effect on the memory cell can be suppressed.

In the third example, no isolation regions are provided at the border between the memory cell region 52 and the NMOS peripheral circuit region 53 in the vicinity of the memory cell of the second p-well 5. Alternatively, isolation regions can be provided at such positions.

In the third example, the area 52 electrically connected to the substrate 1 and the area 53 not directly electrically connected to the substrate 1 are adjacent to each other in the second p-well 5. Another structure can be used in which, for example, the buried p-well 7 is provided in the vicinity of the center of the second p-well 5 so as to be electrically connected with the substrate 1 (i.e., the area 52 is provided in the vicinity of the center of the second p-well 5) and the area 53 not directly electrically connected with the substrate 1 is provided so as to surround the area 52. Alternatively, part of the buried n-well 3 may be formed so as to be surrounded by the buried p-well 7, thereby being placed in a floating condition in which the buried n-well 3 is electrically floated.

In the first through third examples as described above, isolation regions are provided at positions corresponding to all the borders between the wells except for the buried wells. However, formation of the isolation regions in this manner is not necessary.

In addition, instead of simultaneously forming the whole buried n-well 3 at the early stage of the fabrication, the buried n-well 3 may be formed when forming the n-wells and the p-wells. The formation of the buried n-well may be combined with the previously explained simultaneous formation scheme of the buried n-well. In such a case, the profile of the buried n-well at a position immediately below the n-well may be separately set from that of a position immediately below the p-well.

Furthermore, in the first through third examples described above, the first p-well and the second p-well are distinguished from each other by differences in impurity concentrations of the punch through stopper layer and the threshold voltage control layer provided therein, in addition to the presence of the buried p-well immediately below them. It should be noted, however, other modifications can be made as long as the intended scheme of the present invention is followed. For example, the impurity implantation process f or selectively forming the p-wells as illustrated in FIGS. 2E, 3D or 5E may be performed under different conditions from those described above. For example, the first well and the second well may be formed so as to be distinguished from each other only by the presence of the buried p-well immediately there below while respectively setting the impurity concentrations of at least one of, or both of, the punchthrough stopper layer and the threshold voltage control layer provided in the respective wells to be the same level.

As described above, a semiconductor device having a triple-well structure, in which various substrate potentials can be set in one chip with respect to the N-channel MOS transistor and P-channel MOS transistor, can be produced by only adding one mask process to the production method of a conventional semiconductor device having a twin-well structure. Thus, a high-performance semiconductor device (chip) can be produced by adding a minimum possible number of production steps.

According to the present invention, a deep n-well is formed by implanting impurity ions to the entirety of the surface of the semiconductor substrate. During this step, a part of the buried n-well which is just below one of the two types of p-wells having different substrate potentials (usually the p-well having a shallower substrate potential) is counteracted by the counter implantation process, and thus effectively obtains the same conductivity type as that of the substrate.

In the structure in which a prescribed n-well is surrounded by a p-well, individual n-wells can be set to different potential levels from one another. By forming an additional buried p-well, the sheet resistance is reduced, thereby improving the resistance against latch-up.

In accordance with the present invention, when a p-type substrate is employed, the step of forming the buried n-well, which tends to be an unstable implantation process because it requires the highest acceleration energy, can be performed without using a mask. As a result, it becomes possible to eliminate a disadvantage in which the implantation process becomes unstable because of reduction of vacuum in the apparatus, which in turn results from the outgas from the resist upon the implantation process. The above advantage becomes specifically significant when the implantation process at a high acceleration energy is performed using polyvalent ions.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a semiconductor device, comprising the steps of:

performing ion implantation into a substrate of a first conductivity type, thereby forming a first well of a second conductivity type at a deep position in the substrate;

performing ion implantation into the substrate, thereby forming a second well of the first conductivity type and a third well of the first conductivity type both in contact with a top portion of the first well;

forming a fourth well of the second conductivity type at a position corresponding to an area between the second and third wells, the fourth well being formed so as to be in contact with a top portion of the first well; and performing ion implantation, thereby partially counteracting a part of the first well which is just below the third well and instead forming therein a fifth well of the first conductivity type.

2. A method according to claim 1, wherein:

the step of performing the ion implantation for forming the second well and the third well is the step of performing a blanket ion implantation to the substrate using no mask, and a dose of the ion implantation for forming the fourth well is set so as to obtain a prescribed effective concentration of an impurity of the second conductivity type in consideration of the concentration of an impurity of the first conductivity type obtained by the blanket ion implantation.

3. A method according to claim 1, wherein:

during the step of performing the ion implantation for forming the fifth well, a threshold voltage control layer of a transistor to be formed in the third well is simultaneously formed.

4. A method according to claim 1, wherein:

the step of performing the ion implantation for at least partially counteracting a part of the first well includes the step of entirely counteracting the part of the first well which is just below the third well and instead forming therein the fifth well.

5. A method according to claim 1, wherein:

the step of performing the ion implantation for at least partially counteracting a part of the first well includes the step of only partially counteracting the part of the first well which is just below the third well and instead forming therein the fifth well.

6. A method according to claim 1, wherein:

the step of performing the ion implantation for forming the fifth well includes the step of forming a resist mask to cover an area of the third well where a memory cell is to be formed and then performing ion implantation.

* * * * *